United States Patent [19]

Coker et al.

[11] Patent Number: 5,258,940

[45] Date of Patent: Nov. 2, 1993

[54] DISTRIBUTED ARITHMETIC DIGITAL FILTER IN A PARTIAL-RESPONSE MAXIMUM-LIKELIHOOD DISK DRIVE SYSTEM

[75] Inventors: Jonathan D. Coker; Richard L. Galbraith, both of Rochester, Minn.; Pablo A. Ziperovich, San Diego, Calif.

[73] Assignee: International Business Machines Corporation, Armonk, N.Y.

[21] Appl. No.: 851,817

[22] Filed: Mar. 16, 1992

[51] Int. Cl.⁵ .............................................. G06F 15/31
[52] U.S. Cl. ................................................ 364/724.16
[58] Field of Search ..................... 364/724.01, 724.16, 364/724.19, 724.20

[56] References Cited

U.S. PATENT DOCUMENTS

| | | | |
|---|---|---|---|
| 4,450,533 | 5/1984 | Petit et al. | 364/724 |
| 4,454,590 | 6/1984 | Belt et al. | 364/724 |
| 4,484,299 | 11/1984 | Lambourn et al. | 364/724 |
| 4,521,866 | 6/1985 | Petit et al. | 364/724 |
| 4,782,458 | 11/1988 | Bhattacharya et al. | 364/724.16 |
| 4,809,208 | 2/1989 | Hansen et al. | 364/724.12 |
| 4,811,262 | 3/1989 | White | 364/724.01 |
| 4,843,581 | 6/1989 | Cupo et al. | 364/724.16 |
| 4,843,582 | 6/1989 | Heck et al. | 364/724.16 |
| 4,862,402 | 8/1989 | Shah et al. | 364/724.12 |
| 5,132,988 | 7/1992 | Fisher et al. | 364/724.2 |

OTHER PUBLICATIONS

Williams, Charles S. "Designing Digital Filters." pp. 1, 38–41. Englewood Cliffs: Prentice-Hall, Inc.

*Primary Examiner*—Long T. Nguyen
*Attorney, Agent, or Firm*—Joan Pennington; Richard E. Billion; Bradley A. Forrest

[57] ABSTRACT

A 10-tap finite impulse response (FIR) digital filter is provided in a partial response signaling and maximum-likelihood (PRML) data channel. A plurality of partial sums of predetermined tap weights are stored in a palette random access memory (RAM). A fixed qualifier value is received and used together with selected ones of the stored partial sums for calculating a predetermined tap weight. Predetermined filter coefficients are calculated and stored in a filter RAM using the calculated predetermined tap weight and predefined ones of the stored partial sums.

12 Claims, 2 Drawing Sheets

DISTRIBUTED ARITHMETIC DIGITAL FILTER IN A PARTIAL-RESPONSE MAXIMUM-LIKELIHOOD DISK DRIVE SYSTEM

BACKGROUND OF THE INVENTION

1. Field of the Invention

The present invention relates generally to a direct access storage device (DASD) of the type utilizing partial-response signaling and maximum-likelihood (PRML) detection together with digital filtering, and more particularly to a distributed arithmetic implementation of a digital filter in a PRML magnetic recording channel.

2. Description of the Prior Art

Computers often include auxiliary memory storage units having media on which data can be written and from which data can be read for later use. Disk drive units incorporating stacked, commonly rotated rigid magnetic disks are used for storage of data in magnetic form on the disk surfaces. Data is recorded in concentric, radially spaced data information tracks arrayed on the surfaces of the disks. Transducer heads driven in a path toward and away from the drive axis write data to the disks and read data from the disks. Achievement of high data density and high data rates has resulted in the use of a PRML channel for writing and reading digital data on the disks.

To obtain full advantage of the PRML channel, the received signal or the read signal must be passed through a specially designed equalizing filter which produces at its output a signal spectrum corresponding to the wave shape for which the maximum-likelihood detector is designed. When using digital filtering in a PRML system, the filter is located between an analog-to-digital converter (ADC) and other signal processing hardware which controls the system and performs the detection.

Digital filters have been implemented with different filter structures. For example, a distributed arithmetic (DA) implementation of a normal-form of a second-order digital filter is disclosed by U.S. Pat. No. 4,811,262. The disclosed digital filter utilizes a distributed arithmetic table look-up approach including a read only memory containing look-up tables to produce each of the partial products within the filter, which are subsequently summed and recursively used to address the memory.

Digital filters implemented by random access memory (RAM) realize the following advantages over read only storage (ROS) arrangements. Firstly, RAM allows precise tuning at manufacturing; while at best, ROS can give a best fit compromise out of a predetermined set of equalizations which directly affects SER performance. Secondly, RAM allows instant response to magnetic component design changes during development and production; while ROS changes require a new module and associated turnaround times. Thirdly, RAM allows migrateability from product to product.

Known DA digital filters having many taps, such as a ten 10-tap filter would be prohibitively large if implemented in RAM. In a PRML data channel, storing 10 numbers corresponding to the tap weights per equalization and providing hardware for the required additions and subtractions for each RAM value is not practical due to the inherent complexity which would require both significant logic and calculation delay and more importantly, roundoff error becomes very significant. It is desirable to make RAM storage an economically feasible option for a DA digital filter in a PRML data channel.

SUMMARY OF THE INVENTION

A principal object of the invention is to provide an improved digital filter in a PRML magnetic recording channel in a disk file. Other objects are to provide such digital filter substantially without negative effects and that overcome many of the disadvantages of prior art arrangements.

In brief, the objects and advantages of the present invention are achieved by a finite impulse response (FIR) digital filter having T taps in a PRML data channel. A plurality of partial sums of predetermined tap weights are stored in a palette RAM. A fixed qualifier value is received and used together with selected ones of the stored partial sums for calculating a predetermined tap weight. Predetermined filter coefficients are calculated and stored in a filter RAM using the calculated predetermined tap weight and predefined ones of the stored partial sums.

BRIEF DESCRIPTION OF THE DRAWINGS

The present invention together with the above and other objects and advantages may best be understood from the following detailed description of the embodiment of the invention illustrated in the drawings, wherein.

DETAILED DESCRIPTION OF THE PREFERRED EMBODIMENTS

Figure 1:
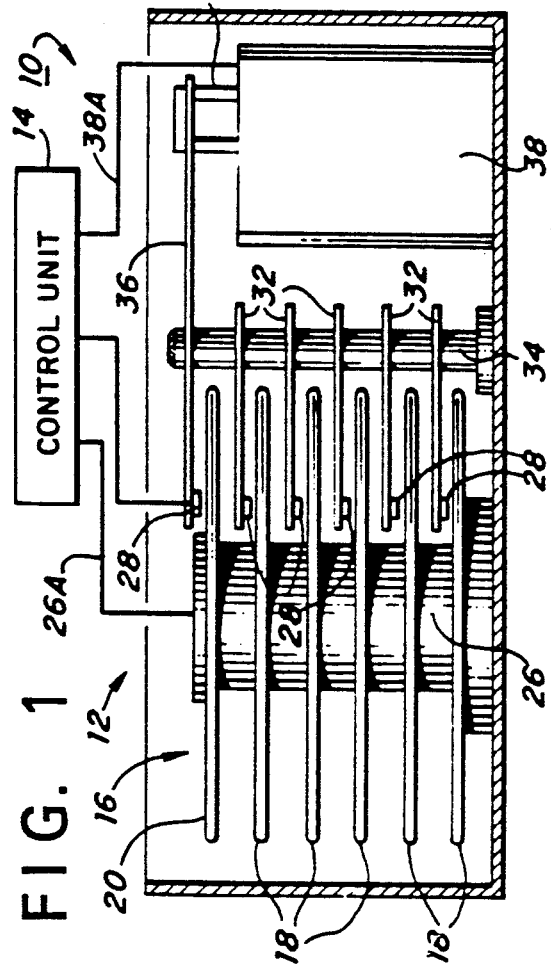
FIG. 1 is a schematic and block diagram of a data storage disk file embodying the present invention.

In FIG. 1 there is shown a partly schematic block diagram of parts of a data storage disk file 10 including a data storage medium generally designated as 12 and a control unit generally designated as 14. In the preferred embodiment of this invention, the data storage medium 12 is embodied in a rigid magnetic disk drive unit 12, although other memory configurations may be used. Unit 12 is illustrated in simplified form sufficient for an understanding of the present invention because the utility of the present invention is not limited to the details of a particular drive unit construction.

Figure 2:
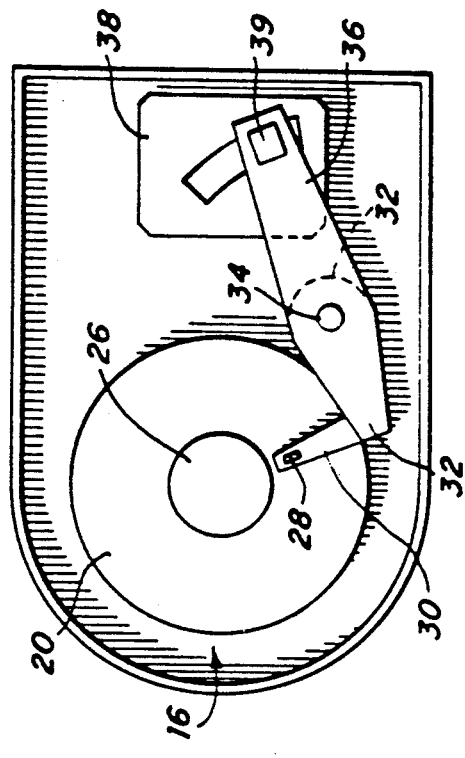
FIG. 2 is a diagram showing the accessing mechanism for a single disk surface of the apparatus of FIG. 1.

Referring now to FIGS. 1 and 2 of the drawings, disk drive unit 12 includes a stack 16 of disks 18 having at least one magnetic surface 20. The disks 18 are mounted in parallel for simultaneous rotation on and by an integrated spindle and motor assembly 26. Data information on each disk 18 are read and/or written to by a corresponding transducer head 28 movable across the disk surface 20.

Transducer heads 28 are mounted on flexure springs 30 carried by arms 32 ganged together for simultaneous pivotal movement about a support spindle 34. One of the arms 32 includes an extension 36 driven in a pivotal motion by a head drive motor 38. Although several drive arrangements are commonly used, the motor 38 can include a voice coil motor 39 cooperating with a magnet and core assembly (not seen) operatively controlled for moving the transducer heads 28 in synchronism in a radial direction in order to position the heads in registration with data cylinders to be followed. The VCM 39 is movable within a fixed magnetic field, and the direction and velocity of the coil movement is controlled by the current supplied. During operation of the disk file 10, the various components of the disk file 10 are controlled in operation by signals generated by control unit 34 such as motor control signals on line 26A and position control signals on line 38A.

Figure 3:
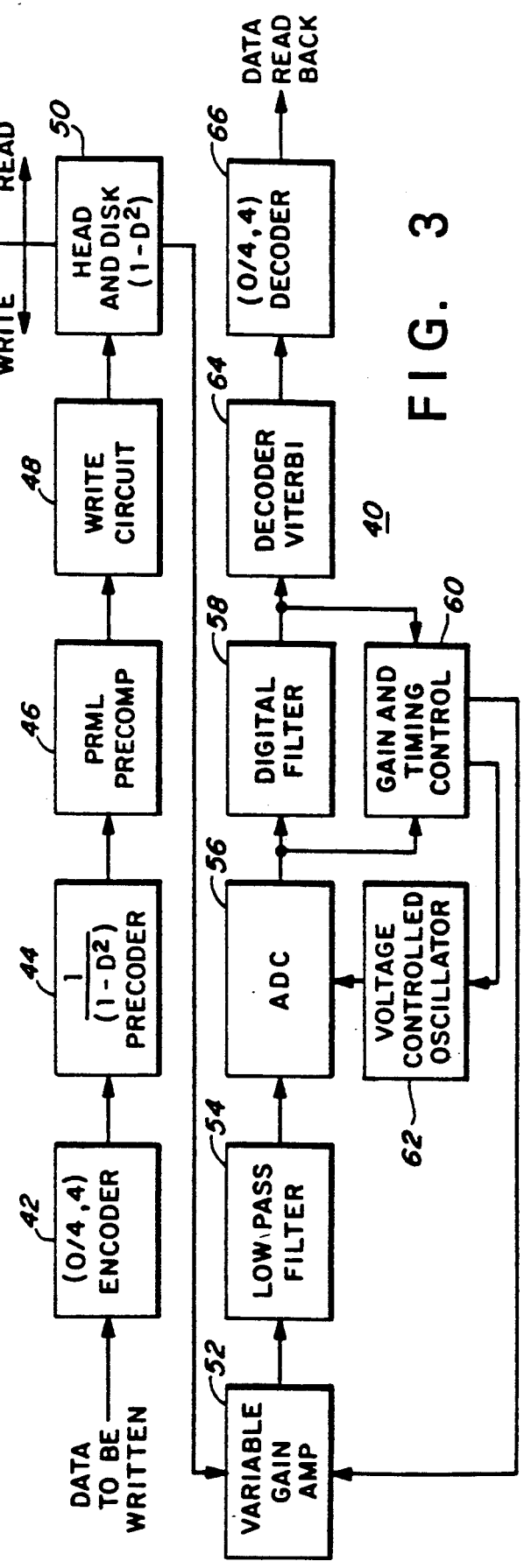
FIG. 3 is a block diagram illustrating a partial-response signaling and maximum-likelihood (PRML) channel in the data storage disk file of FIG. 1.

Referring now to FIG. 3, there is shown a block diagram of a partial-response maximum-likelihood (PRML) recording channel 40 available in the disk file 10 including a digital filter function of the invention. Data to be written is applied to an encoder 42 for providing a modulation coded output having predefined run length constraints, for example, such as, for the minimum and maximum number of consecutive zeros and the maximum run length of zeros in the even and odd recorded sequences in the overall recorded sequence. A precoder 44 follows the encoder 42 described by a $1/(1-D^2)$ operation where D is a unit delay operator. A PRML precomp 46 coupled to the precoder 44 provides a modulated binary pulse signal applied to a write circuit 48 that provides the modulated write current for writing to the disk surface. An analog read signal is obtained at head and disk block 50 described by the $(1-D^2)$ operation. The read signal is applied to a variable gain amplifier (VGA) 52 and the amplified read signal is applied to a lowpass filter 54. The filtered read signal is converted to digital form by an analog-to-digital converter (ADC) 56 that provides, for example, such as 64 possible 6-bit sampled values.

The samples of the ADC 56 are applied to a digital filter 58, such as a 10 tap finite impulse response (FIR) digital filter arranged in accordance with the invention, and are applied to a gain and timing control 60. The gain and timing control 60 provides a gain and control signal to the VGA 52 and provides a timing control signal to the ADC 56 via a voltage controlled oscillator 62. The filtered signal from the digital filter 58 is applied to a Viterbi decoder 64 coupled to a decoder 66 to complete the maximum-likelihood (ML) detection process for data read back.

Figure 4:
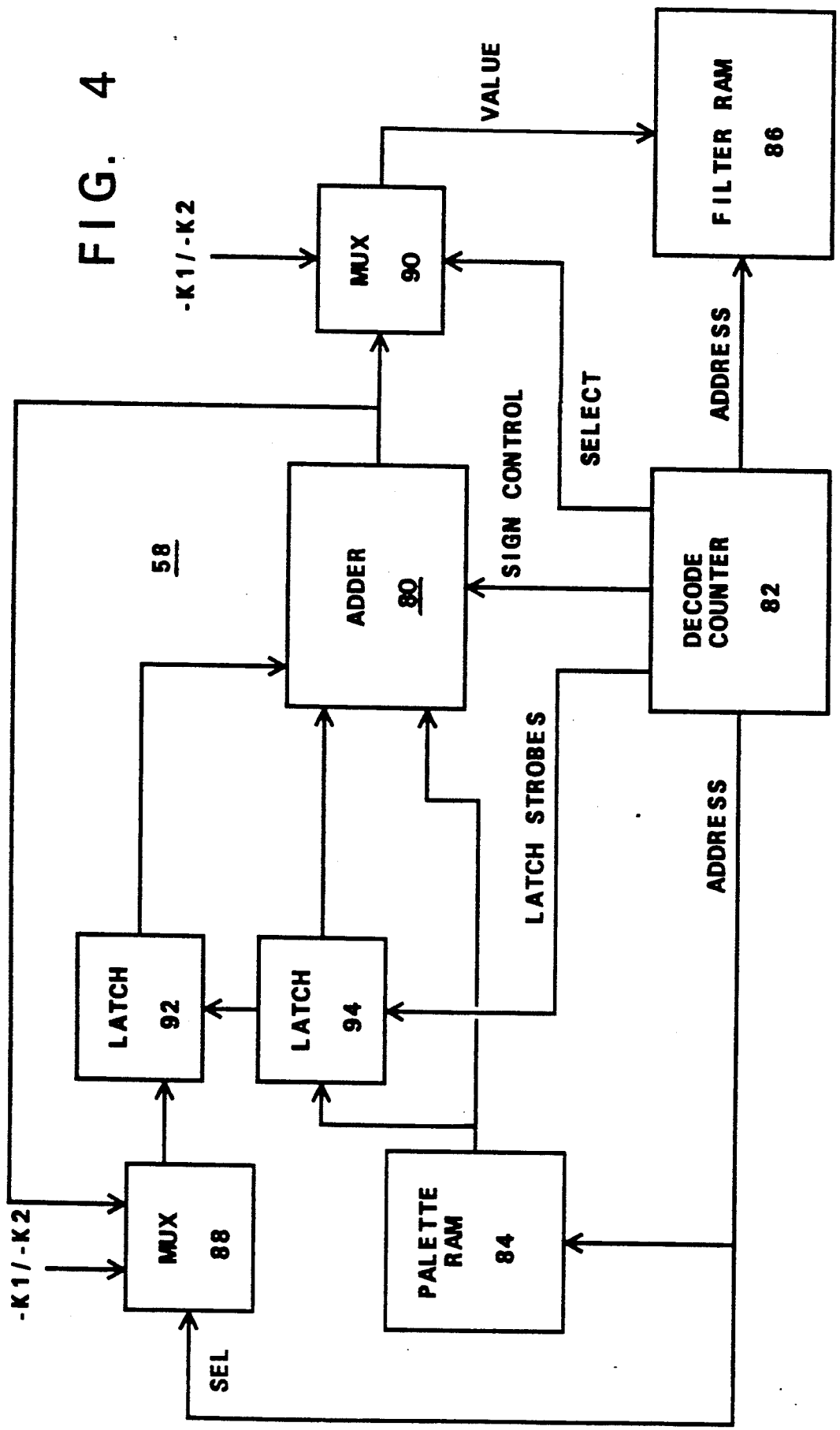
FIG. 4 is a block diagram of a digital filter of the present invention.

Referring to FIG. 4, there is shown a block diagram representation of the digital filter 58 arranged in accordance with the invention.

The FIR digital filter 58 is defined by the following relationship:

$$y_n = \sum_{k=1}^{10} T_k x_{n-k}$$

where $y_n$ is the output sample of the filter at instant n, $T_1 \ldots T_{10}$ are tap weights, and $x_n$ is the $n^{th}$ digital sample.

Digital filter 58 stores the 32 numbers in its internal RAM 86 in FIG. 4 as follows:

TABLE 1

| FILTER RAM ADDRESS | VALUES STORED IN FILTER RAM |
|---|---|
| 00000 | $(-T_1) + (-T_3) + (-T_5) + (-T_7) + (-T_9)$ |
| 00001 | $(-T_1) + (-T_3) + (-T_5) + (+T_7) + (-T_9)$ |
| 00010 | $(-T_1) + (-T_3) + (+T_5) + (-T_7) + (-T_9)$ |
| 00011 | $(-T_1) + (-T_3) + (+T_5) + (+T_7) + (-T_9)$ |
| 00100 | $(-T_1) + (+T_3) + (-T_5) + (-T_7) + (-T_9)$ |
| 00101 | $(-T_1) + (+T_3) + (-T_5) + (+T_7) + (-T_9)$ |

TABLE 1-continued

| FILTER RAM ADDRESS | VALUES STORED IN FILTER RAM |
|---|---|
| 00110 | $(-T_1) + (+T_3) + (+T_5) + (-T_7) + (-T_9)$ |
| 00111 | $(-T_1) + (+T_3) + (+T_5) + (+T_7) + (-T_9)$ |
| 01000 | $(+T_1) + (-T_3) + (-T_5) + (-T_7) + (-T_9)$ |
| 01001 | $(+T_1) + (-T_3) + (-T_5) + (+T_7) + (-T_9)$ |
| 01010 | $(+T_1) + (-T_3) + (+T_5) + (-T_7) + (-T_9)$ |
| 01011 | $(+T_1) + (-T_3) + (+T_5) + (+T_7) + (-T_9)$ |
| 01100 | $(+T_1) + (+T_3) + (-T_5) + (-T_7) + (-T_9)$ |
| 01101 | $(+T_1) + (+T_3) + (-T_5) + (+T_7) + (-T_9)$ |
| 01110 | $(+T_1) + (+T_3) + (+T_5) + (-T_7) + (-T_9)$ |
| 01111 | $(+T_1) + (+T_3) + (+T_5) + (+T_7) + (-T_9)$ |
| 10000 | $(-T_2) + (-T_4) + (-T_6) + (-T_8) + (-T_{10})$ |
| 10001 | $(-T_2) + (-T_4) + (-T_6) + (+T_8) + (-T_{10})$ |
| 10010 | $(-T_2) + (-T_4) + (+T_6) + (-T_8) + (-T_{10})$ |
| 10011 | $(-T_2) + (-T_4) + (+T_6) + (+T_8) + (-T_{10})$ |
| 10100 | $(-T_2) + (+T_4) + (-T_6) + (-T_8) + (-T_{10})$ |
| 10101 | $(-T_2) + (+T_4) + (-T_6) + (+T_8) + (-T_{10})$ |
| 10110 | $(-T_2) + (+T_4) + (+T_6) + (-T_8) + (-T_{10})$ |
| 10111 | $(-T_2) + (+T_4) + (+T_6) + (+T_8) + (-T_{10})$ |
| 11000 | $(+T_2) + (-T_4) + (-T_6) + (-T_8) + (-T_{10})$ |
| 11001 | $(+T_2) + (-T_4) + (-T_6) + (+T_8) + (-T_{10})$ |
| 11010 | $(+T_2) + (-T_4) + (+T_6) + (-T_8) + (-T_{10})$ |
| 11011 | $(+T_2) + (-T_4) + (+T_6) + (+T_8) + (-T_{10})$ |
| 11100 | $(+T_2) + (+T_4) + (-T_6) + (-T_8) + (-T_{10})$ |
| 11101 | $(+T_2) + (+T_4) + (-T_6) + (+T_8) + (-T_{10})$ |
| 11110 | $(+T_2) + (+T_4) + (+T_6) + (-T_8) + (-T_{10})$ |
| 11111 | $(+T_2) + (+T_4) + (+T_6) + (+T_8) + (-T_{10})$ |

These 32 numbers are functions of the 10 tap weights. Each equalization is stored in eight 9 bit numbers, with negligible roundoff error upon expansion. In accordance with a feature of the invention, 10 tap weights are stored in 8 numbers as follows.

First, the tap weights must obey one of the following constraints:

$$\sum_{n=1}^{10} T_n e^{j\frac{\pi}{2}n} = \begin{cases} \pm 1 + j0 \\ 0 \pm j \\ \pm\sqrt{2} \pm j\sqrt{2} \\ \mp\sqrt{2} \pm j\sqrt{2} \end{cases}$$

These constraints are required for synchronization reasons reduce the degrees of freedom in a 10-tap filler to 8 so that given any 8 tap weights, the other 2 are fixed. Utilizing these constraints, 2 tap weights are derived from the 8 given numbers, defined as follows:

$$T_1 - T_3 + T_5 - T_7 + T_9 = K_1$$

$$T_2 - T_4 + T_6 - T_8 + T_{10} = K_2$$

When four even taps are given, the fifth is calculable given $K_2$. Similarly, when four odd taps are given, the fifth is calculable given $K_1$. The predetermined values $K_1$, $K_2$ depends upon the filter mode.

The 8 tap weights are stored in a palette RAM storage 84 in FIG. 4 as follows:

TABLE 2

| PALETTE RAM TABLE CONTENTS | |
|---|---|
| PALETTE RAM ADDRESS | VALUES STORED IN PALETTE RAM |
| $A_0A_1A_2A_3A_4A_5$000 | $T_3-T_5$ |
| $A_0A_1A_2A_3A_4A_5$001 | $-T_3-T_5$ |
| $A_0A_1A_2A_3A_4A_5$010 | $T_7-T_9$ |
| $A_0A_1A_2A_3A_4A_5$011 | $-T_7-T_9$ |
| $A_0A_1A_2A_3A_4A_5$100 | $T_4-T_6$ |
| $A_0A_1A_2A_3A_4A_5$101 | $-T_4-T_6$ |
| $A_0A_1A_2A_3A_4A_5$110 | $T_8-T_{10}$ |

TABLE 2-continued

| PALETTE RAM TABLE CONTENTS | |
|---|---|
| PALETTE RAM ADDRESS | VALUES STORED IN PALETTE RAM |
| $A_0A_1A_2A_3A_4A_5111$ | $-T_8-T_{10}$ |

Eight numbers of partial sums involving four taps of each interleave are stored in the palette RAM 84 for each equalization. Storage efficiency remains unaffected as compared to a straightforward method given the above constraints of storing 8 tap weights. However, directly storing 8 tap weights provides deleterious roundoff properties and is not optimum for logic complexity/speed.

$T_1$ is derived using the equation $T_1-T_3+T_5-T_7+T_9=K_1$. Each address from 00000 through 01111 of the odd tap filter RAM 86 is then loaded by performing three additions (or subtractions) involving the calculated value $T_1$ and two palette RAM values. For example, as set forth in table 1, the filter RAM value for location 00001 is $$-[T_1]+[-T_3-T_5]+[T_7-T_9].$$

Similarly, $T_2$ is derived using the equation $T_2-T_4+T_6-T_8+T_{10}=K_2$ used for loading each address 10000 through 11111 of the even tap filter RAM locations. The required operations for each filter RAM value are listed in the following table 3, where $P_n$ represents the $n^{th}$ value of the appropriate palette RAM space.

TABLE 3

| FILTER RAM ADDRESS | REQUIRED OPERATION FOR LOCATION | |
|---|---|---|
| 00000 | $-T_1 + P_1 + P_3$ | |
| 00001 | $-T_1 + P_1 + P_2$ | |
| 00010 | $-T_1 - P_0 + P_3$ | |
| 00011 | $-T_1 - P_0 + P_2$ | |
| 00100 | $-T_1 + P_0 + P_3$ | $(= -K_1)$ |
| 00101 | $-T_1 + P_0 + P_2$ | |
| 00110 | $-T_1 - P_1 + P_3$ | |
| 00111 | $-T_1 - P_1 + P_2$ | |
| 01000 | $+T_1 + P_1 + P_3$ | |
| 01001 | $+T_1 + P_1 + P_2$ | |
| 01010 | $+T_1 - P_0 + P_3$ | |
| 01011 | $+T_1 - P_0 + P_2$ | |
| 01100 | $+T_1 + P_0 + P_3$ | |
| 01101 | $+T_1 + P_0 + P_2$ | |
| 01110 | $+T_1 - P_1 + P_3$ | |
| 01111 | $+T_1 - P_1 + P_2$ | |
| 10000 | $-T_2 + P_5 + P_7$ | |
| 10001 | $-T_2 + P_5 + P_6$ | |
| 10010 | $-T_2 - P_4 + P_7$ | |
| 10011 | $-T_2 - P_4 + P_6$ | |
| 10100 | $-T_2 + P_4 + P_7$ | $(= -K_2)$ |
| 10101 | $-T_2 + P_4 + P_6$ | |
| 10110 | $-T_2 - P_5 + P_7$ | |
| 10111 | $-T_2 - P_5 + P_6$ | |
| 11000 | $+T_2 + P_5 + P_7$ | |
| 11001 | $+T_2 + P_5 + P_6$ | |
| 11010 | $+T_2 - P_4 + P_7$ | |
| 11011 | $+T_2 - P_4 + P_6$ | |
| 11100 | $+T_2 + P_4 + P_7$ | |
| 11101 | $+T_2 + P_4 + P_6$ | |
| 11110 | $+T_2 - P_5 + P_7$ | |
| 11111 | $+T_2 - P_5 + P_6$ | |

Acceptable roundoff error characteristics are achieved by minimizing addition operations.

FIG. 4 illustrates the DA filter 58 implementing the operations listed in Table 3. A 3-way adder 80 implements the operations required in table 3. A decoder counter 82 provides required control signals for the filter 58 including appropriate address and R/W control for both a palette RAM 84 and a filter RAM 86, select bits for two multiplexers 88 and 90, sign control for the adder 80, and strobe signals for two data latches 92 and 94. For the odd tap weight filter RAM portion, the initial operations of the circuit is to calculate $-T_1$, for example, equal to $-P_0-P_3-K_1$. The calculated $-T_1$ result is wrapped back to the top latch 92 for subsequent operations, and the value $-K_1$ is selected for storage into the appropriate location of the filter RAM 86, such as address 00010. The remaining 15 odd tap filter values are calculated by presenting $P_n$ values from the palette RAM 84 to the bottom two inputs of the adder 80 with appropriate sign control for direct storage into filter RAM 86. Then the operation is repeated in a similar fashion for the even interleave with $-K_2$ appearing at the input to the multiplexers 88 and 90, and $-T_2$ calculated and saved in the top latch 92. By this method, separate hardware for $T_1$, $T_2$ calculations is not required.

Roundoff error present in all calculations is minimized by minimizing the roundoff error present in the calculated values $T_1$, $T_2$. Gain control 60 provides controlled, incremental adjustments to the gain of the filter 58 in such a way that the roundoff errors present in the sum $T_1 = -P_0-P_3-K_1$ cancel out. Thus, $T_1$ will include the same number of significant digits as the stored RAM values in the palette RAM 84 and the filter RAM 86. The output of the three-way adder 80 will have at worst case 1 LSB of roundoff error. The order of magnitude of the palette RAM LSB is one less than the output of the digital filter sum structure, making this roundoff error difference negligible.

As implemented, the DA filter 58 requires for example, 320 clock cycles to load the filter RAM 86 or about 5% of a sector time after receiving the 8-bit qualifier from the product logic. A nine-bit binary counter can implement the decode counter 82 with the five most significant bits 0-4 in which each state represents the time required to expand and load one linear sum of the even/odd tap weights from the palette RAM 84 to the filter RAM 86. The least significant four bits 5-8 act as subcycles for implementing the operations listed in Table 3 with 10 subcycles times the 32 filter RAM locations equal to the 320 bit rate clock cycles required to load the filter RAM 86.

In brief summary, the effective equalization storage efficiency of digital filter 58 is superior to known straightforward compression/expansion schemes. First, the number of values required to store the equalization is less than the number of tap weights. Second, the expansion technique guarantees minimal roundoff error as well as acceptable logic complexity and speed by minimizing the number of arithmetic operations required to calculate the results. Unlike straightforward methods, the technique does not require that the storage palette RAM 84 be wider than the filter RAM 86 for acceptable roundoff characteristics.

In addition, the use of on-channel equalization storage, in lieu of file processor storage, allows indexing of equalizations. After a power-on routine, the file processor need only specify an equalization qualifier when an equalization change is appropriate. Advantages include first, extensive file RAM is not required and second, information transfer rate is sped up, for example by $8 \times -32 \times$, improving interface overhead time.

While the invention has been described with reference to details of the illustrated embodiment, these details are not intended to limit the scope of the invention as defined in the appended claims.

What is claimed and desired to be secured by Letters Patent of the United States is:

1. A finite impulse response (FIR) digital filter comprising:
   means for storing a plurality of partial sums of predetermined tap weights;
   means for receiving a fixed qualifier value;
   means for calculating a predetermined tap weight using selected ones of said stored partial sums and said received fixed value;
   means for calculating predetermined filter coefficients using said calculated predetermined tap weight and predefined ones of said stored partial sums; and
   means for storing said calculated predetermined filter coefficients.

2. A finite impulse response (FIR) digital filter as recited in claim 1 wherein said partial sums storing means includes a random access memory (RAM) and said filter coefficient storing means includes a random access memory (RAM).

3. A finite impulse response (FIR) digital filter as recited in claim 1 wherein said stored plurality of partial sums of tap weights include a plurality of stored partial sums of predetermined odd tap weights and a plurality of stored partial sums of predetermined even tap weights.

4. A finite impulse response (FIR) digital filter as recited in claim 3 wherein a number of tap weights equals 10 and 4 partial sums of both predetermined odd and even tap weights are stored.

5. A finite impulse response (FIR) digital filter as recited in claim 4 wherein said fixed qualifier value includes a first fixed qualifier value $K_1$ used for calculating odd filter coefficients and a second fixed qualifier value $K_2$ used for calculating even filter coefficients.

6. A finite impulse response (FIR) digital filter as recited in claim 5 wherein said first fixed qualifier value $K_1$ is defined by $T_1-T_3+T_5-T_7+T_9$ and wherein said second fixed qualifier value $K_2$ is defined by $T_2-T_4+T_6-T_8+T_{10}$.

7. A finite impulse response (FIR) digital filter as recited in claim 8 wherein said calculated predetermined filter coefficients include 32 values, each calculated value is stored in predetermined one of two 16×9-bit RAM locations.

8. A finite impulse response (FIR) digital filter as recited in claim 1 wherein said calculating means includes a 3-way adder.

9. A finite impulse response (FIR) digital filter as recited in claim 6 wherein said partial sum storing means includes a random access memory (RAM) having addressable storage locations, one addressable location for storing each of said partial sums of predetermined tap weights, and wherein said 3-way adder receives two of said stored partial sums read from selected RAM locations for calculating said predetermined tap weight and for calculating each predetermined filter coefficient.

10. A finite impulse response (FIR) digital filter comprising:
    random access memory means for storing a plurality of partial sums of predetermined odd tap weights and for storing a plurality of partial sums of predetermined even tap weights;
    means for receiving an odd fixed qualifier value and an even fixed qualifier value;
    adder means for calculating a predetermined odd tap weight and a predetermined even tap weight, said predetermined odd tap weight being calculated by adding two of said stored partial sums of predetermined odd tap weights and said received odd fixed value; said predetermined even tap weight being calculated by adding two of said stored partial sums of predetermined even tap weights and said received even fixed value;
    said adder means for calculating predetermined filter coefficients using said calculated predetermined tap weight and predefined ones of said stored partial sums; and
    random access memory means for storing said calculated predetermined filter coefficients.

11. A finite impulse response (FIR) digital filter as recited in claim 10 further including a counter for providing control signals including sign control to said adder means.

12. A direct access storage device of the type including a partial-response maximum-likelihood (PRML) data channel comprising:
    a housing;
    at least one disk mounted in said housing for rotation about an axis and having at least one disk surface for storing data;
    transducer means mounted for movement across said disk surface for reading and writing data to said disk surface;
    a digital filter in said PRML data channel coupled to said transducer means for filtering digital sample values, said digital filter including;
    means for storing a plurality of partial sums of predetermined tap weights;
    means for receiving a fixed qualifier value;
    means for calculating a predetermined tap weight using selected ones of said stored partial sums and said received fixed value;
    means for calculating predetermined filter coefficients using said calculated predetermined tap weight and predefined ones of said stored partial sums; and
    means for storing said calculated predetermined filter coefficients.

* * * * *